(12) United States Patent
Stuetzel et al.

(10) Patent No.: US 8,470,632 B2
(45) Date of Patent: Jun. 25, 2013

(54) PROCESS FOR PRODUCING DOPED SILICON LAYERS, SILICON LAYERS OBTAINABLE BY THE PROCESS AND USE THEREOF

(75) Inventors: Bernhard Stuetzel, Marl (DE); Wolfgang Fahrner, Gundelfingen (DE)

(73) Assignee: Evonik Degussa GmbH, Essen (DE)

( * ) Notice: Subject to any disclaimer, the term of this patent is extended or adjusted under 35 U.S.C. 154(b) by 0 days.

(21) Appl. No.: 13/502,629

(22) PCT Filed: Nov. 10, 2010

(86) PCT No.: PCT/EP2010/067224
§ 371 (c)(1),
(2), (4) Date: Apr. 18, 2012

(87) PCT Pub. No.: WO2011/061109
PCT Pub. Date: May 26, 2011

(65) Prior Publication Data
US 2012/0199832 A1 Aug. 9, 2012

(30) Foreign Application Priority Data
Nov. 18, 2009 (DE) .......... 10 2009 053 818

(51) Int. Cl.
*H01L 21/00* (2006.01)

(52) U.S. Cl.
USPC .............. 438/77; 438/501; 257/E27.125

(58) Field of Classification Search
USPC ..... 438/77, 491, 499, 501, 502; 257/E27.125
See application file for complete search history.

(56) References Cited

U.S. PATENT DOCUMENTS 6,613,653 B2 * 9/2003 Naseem et al. ............ 438/486

| | | |
|---|---|---|
| 2008/0048240 A1 | 2/2008 | Kamath et al. |
| 2010/0163962 A1 | 7/2010 | Kamath et al. |
| 2011/0189072 A1 | 8/2011 | Brausch et al. |
| 2012/0042951 A1 | 2/2012 | Stuetzel et al. |
| 2012/0205654 A1 | 8/2012 | Stuetzel et al. |
| 2012/0291665 A1 | 11/2012 | Wieber et al. |

FOREIGN PATENT DOCUMENTS

| | | |
|---|---|---|
| EP | 1 892 753 | 2/2008 |
| JP | 2002 025926 | 1/2002 |
| JP | 2004 186320 | 7/2004 |
| WO | 2007 044429 | 4/2007 |

OTHER PUBLICATIONS

International Search Report issued on Mar. 22, 2011 in PCT/EP10/067224 filed on Nov. 10, 2010.

\* cited by examiner

*Primary Examiner* — Quoc Hoang
(74) *Attorney, Agent, or Firm* — Oblon, Spivak, McClelland, Maier & Neustadt, L.L.P.

(57) ABSTRACT

The present invention relates to a process for producing a doped silicon layer on a substrate, comprising the steps of (a) providing a liquid silane formulation and a substrate, (b) applying the liquid silane formulation to the substrate, (c) introducing electromagnetic and/or thermal energy to obtain an at least partly polymorphic silicon layer, (d) providing a liquid formulation which comprises at least one aluminum-containing metal complex, (e) applying this formulation to the silicon layer obtained after step (c) and then (f) heating the coating obtained after step (e) by introducing electromagnetic and/or thermal energy, which decomposes the formulation obtained after step (d) at least to metal and hydrogen, and then (g) cooling the coating obtained after step (f) to obtain an Al-doped or Al- and metal-doped silicon layer, to doped silicon layers obtainable by the process and to the use thereof for production of light-sensitive elements and electronic components.

20 Claims, 1 Drawing Sheet

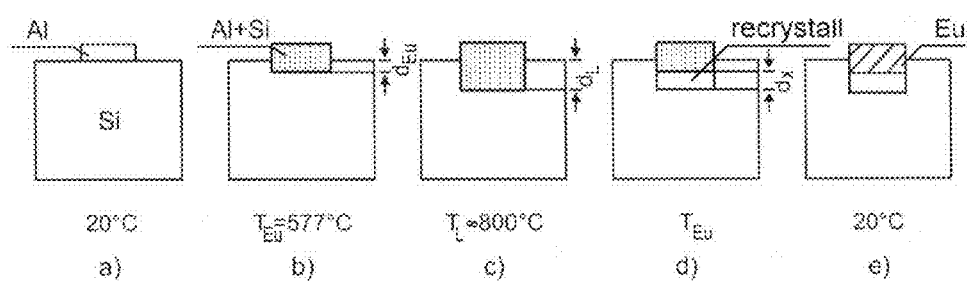
Partial dissolution and solidification process for an aluminium-silicon structure

PROCESS FOR PRODUCING DOPED SILICON LAYERS, SILICON LAYERS OBTAINABLE BY THE PROCESS AND USE THEREOF

The invention relates to a process for producing a doped silicon layer on a substrate. The invention also relates to the silicon layers obtainable by this process and to the use thereof for production of light-sensitive elements and electronic components.

In the production of solar cells, semiconductor layers of different doping with at least one pn junction are required.

By deposition of one or more layer sequences of liquid phases containing silanes among other substances on a suitable substrate, it is possible to obtain a pn junction which acts as a solar cell. The customary procedure in the production of silicon layers containing pn junctions consists in the respective doping of the individual layers, for example with phosphorus as the n-silicon layer, for example with boron as the p-silicon layer, by adding suitable phosphorus or boron compounds to the liquid formulations. These may themselves be liquid or dissolve in the formulation.

In the prior art, n- or p-doped silicon layers are each produced successively from these solutions by applying the liquid formulation to suitable conductive substrates, for example by spin-coating, and then converting it to silicon. The steps are
i) providing a substrate,
ii) providing a formulation containing at least one silicon compound and optionally a phosphorus or boron compound,
iii) coating the substrate with the formulation,
iv) irradiating and/or thermally treating the coated substrate to form an at least partly polymorphic layer consisting predominantly of silicon.

The silicon layers thus obtained typically comprise a mixture of microcrystalline, nanocrystalline and amorphous structures. Layers with such structures are referred to here and hereinafter as "polymorphic". An exact distinction and identification of the crystalline structure of polymorphic layers is not possible in most cases, or is of minor importance for the intended uses.

Three problems occur in the conventional production of silicon layers outlined above.

Firstly, the liquid phosphorus or boron compounds are often volatile compounds which boil below 250° C. and therefore escape from the layer via evaporation in the course of heating of the substrate coated with the liquid silane formulation before the formulation can form a solid. This is because the conversion of the liquid silane formulation to a polymorphic silicon layer takes place at temperatures from about 350° C. This means that, before phosphorus or boron dopant atoms can be incorporated into the morphological structure of the solid-state silicon which forms, the compounds which contain these atoms have already left the layer at least for the most part.

Attempts are made to counteract this with a co-oligomerization of phosphine or borane compounds with liquid silanes, which increases the boiling point of the substances containing dopant atoms. However, a large excess of dopant is required here too, because the Si—P and Si—B bonds are very labile, and the majority of the phosphorus or boron supplied still disappears in the form of volatile components as a result of redissociation even in the course of heating between 200 and 350° C.

Secondly, the remaining dopant atoms are also not incorporated directly in the case of silicon which has been produced from liquid formulations. Therefore, a considerable excess of phosphorus or boron compounds and relatively high temperatures are also required, in order to introduce the dopant atoms effectively into the polymorphic silicon structure.

Thirdly, in the case of buildup of a layer sequence composed of an amorphous or polymorphic n-silicon layer and an amorphous or polymorphic p-silicon layer, a layer bond which continues the morphological structure must form in order to obtain a functioning solar cell. Layer sequences composed of an amorphous or polymorphic n-silicon layer and an amorphous or polymorphic p-silicon layer are obtained, for example, by repeated coating.

In the conventional CVD and PECVD processes, the buildup of such layer sequences proceeds efficiently for layer junctions with continuous n- and p-zones. In the case of liquid-based processes for production of doped silicon layers, in contrast, such layer sequences form less efficiently, because disruptive structures occur at the interfaces, known as dangling bonds, which hinder or complicate the buildup of each pn junction.

The processes described in the prior art for aluminium doping of semiconductor layers are likewise disadvantageous, since they are too complex: for example DE 24 44 881 A1 describes an alloying process for producing a semiconductor component having a semiconductor body composed of silicon, in which an aluminium-containing layer is alloyed onto the anode side to form a silicon-aluminium eutectic. However, this process is too complex in apparatus terms to have good integratability into a liquid phase process for production of silicon-containing layers (i.e. for production of silicon-containing layers from liquid silicon precursors). H. Ryssel further describes, in "Lexikon Elektronik und Mikroelektronik" ["Lexicon of Electronics and Microelectronics"], editors Dieter Sautter, Hans Weinerth, VDI-Verlag Düsseldorf (1993), the doping of semiconductor components with an aluminium foil, screen printing application or a vapour-deposited aluminium layer by heating beyond the eutectic point. However, these processes too are too complex for integration into liquid phase processes for producing silicon-containing layers. For conventional wafer-based solar cells, p-doping by aluminium is additionally described for reverse side contact or the back-surface field (EP0776051, DE 197 58 712 B4, WO 2009048332, US2005074917, U.S. Pat. No. 5,766,964). However, the documents cited are all based on processes which are likewise too complex for liquid phase processes.

It was thus an object of the present invention to avoid the aforementioned disadvantages and to provide a process with a low level of technical complexity, which avoids or reduces the level of disruptive structures in the course of doping of silicon layers and in the course of production of layer sequences of different doping, and which is useable efficiently especially in liquid phase processes for production of silicon-containing layers.

Surprisingly, the difficulties described above are avoided by using a liquid aluminium-containing metal complex as a dopant for an already formed silicon layer or the monomeric, oligomeric or polymeric precursor thereof.

The invention thus provides a process for producing a doped silicon layer on a substrate, comprising the steps of
(a) providing a liquid silane formulation and a substrate,
(b) applying the liquid silane formulation to the substrate,
(c) introducing electromagnetic and/or thermal energy to obtain an at least partly polymorphic silicon layer,
(d) providing a liquid formulation which comprises at least one aluminium-containing metal complex, (e) applying this formulation to the silicon layer obtained after step (c) and then (f) heating the coating obtained after step (e) by introducing electromagnetic and/or thermal energy, which decomposes the formulation obtained after step (d) at least to metal and hydrogen and preferably also partly dries hydrogen out of (a), and then (g) cooling the coating obtained after step (f) to obtain an Al-doped or Al- and metal-doped silicon layer, which may still contain hydrogen.

This process according to the invention leads to ex-situ-doped silicon layers. A liquid silane composition in the context of the present invention is understood to mean a composition which is liquid at standard pressure and temperature, optionally contains solvent, and contains at least one hydridosilane which is of the generic formula $Si_nH_{2n+2}$ (where $n \geq 3$) and is present in liquid form at standard pressure and standard temperature (0° C. and 1 bar). The liquid silane composition preferably consists exclusively of liquid or solid hydridosilanes of the generic formula $Si_nH_{2n+2}$ (where $n \geq 3$) and optionally at least one solvent.

In addition to the avoidance of the disadvantages which exist for the prior art, the process according to the invention has the advantage that the Al or Al and metal of the aluminium-containing metal complex alloys to the solid-state silicon during step (f), and dangling bonds at interfaces are therefore avoided.

In the process according to the invention, performance of step (c) leaves an at least partly polymorphic silicon layer. During the performance of step (f), a liquid phase composed of Al and Si forms at the layer boundary thereof. Recrystallization of this phase in the course of cooling during step (g) leads to incorporation of Al as a dopant into the recrystallized layer, and the presence of a p-doped zone at the surface of the silicon after step (g).

The present invention is described in detail hereinafter.

It may be advantageous to provide, in step (a) of the process according to the invention, a substrate which has reverse side contact to the output of the current generated. The substrate may more preferably be selected from metal, conductive material, or insulator or semiconductor coated with conductive material.

In addition, preference is given to selecting a substrate which, at the maximum temperature which is attained in step (f), neither forms a eutectic with the silicon nor has diffusion into the silicon layer obtained after step (c). Under these prerequisites, it is possible to select all metals or alloys known to those skilled in the art. A description can be found, for example, in T. B. Massalski, H. Okamoto, P. R. Subramanian, L. Kacprzak in "*Binary Alloy Phase Diagrams*", 2nd edition, ASM International, Metals Park Ohio 1990, or in O. Ikeda, Y. Himuro, I. Ohnuma, R. Kainuma and K. Ishida in "*Phase equilibria in the Fe-rich portion of the Fe—Ni—Si system*", *Journal of Alloys and Compounds*, Volume 268, Issues 1-2, 27 Mar. 1998, on pages 130-136.

The aluminium-containing metal complexes for use in step (d) are understood in the present context to mean aluminium-containing coordination compounds (i.e. compounds having at least one metal centre, which metal centre in at least one case consists of aluminium, and an appropriate number of ligands), which can be decomposed at least to metal (especially aluminium) and hydrogen. The aluminium-containing metal complexes may be pure metal hydrides, hydridic aluminium-containing coordination compounds, or aluminium-containing non-hydridic coordination compounds, with the proviso that the latter can be decomposed to metal and hydrogen.

It is possible with preference, in step (d) of the process according to the invention, to use aluminium-containing metal complexes which, as well as Al, have further metals suitable as dopant metals for silicon. Suitable metals are all trivalent metals which bring about p-doping as a result of electron deficiency, and can be alloyed with Si as shown by a phase diagram. These preferably include B, G, In, Tl.

It is possible with particular preference, in step (d), to use compounds which are selected from metal hydride, metal hydridoalkyl, metal alkyl, and/or metal alkyl halogen complexes, especially those selected from metal hydrides, metal hydridoalkyls, metal alkyls, and/or metal alkyl halides. Particular preference is further given to using those complexes which are liquid. When metal hydride, metal hydridoalkyl, metal alkyl, and/or metal alkyl halogen complexes which are not liquid are used, these complexes are preferably dissolved in at least one solvent. This solvent is, or these solvents are, also driven out in step (f).

Additionally preferably, mixtures of aluminium compounds and boron compounds are used.

Additionally preferably, at least one liquid aluminium hydride complex can be used in step (d) of the process according to the invention. The advantage is that such a compound decomposes to metallic aluminium and hydrogen even at temperatures below 200° C. When the formulation which comprises an aluminium hydride complex is applied to the silicon layer obtained after step (c), preferably by spin-coating, finely divided metallic aluminium is formed during step (f) at 200° C. and dopes the solid-state silicon.

By virtue of the inventive introduction of electromagnetic and/or thermal energy during step (f), the coating obtained after step (e) can be heated to a temperature $T_{Eu}$ of 577° C., which forms a eutectic alloy with Al. The Si—Al eutectic consists of 11.3% silicon and 88.7% aluminium, described, for example, in Max Hansen, "*Constitution of Binary Alloys*", McGraw-Hill Book Company, 1958.

It may be advantageous, in step (f) of the process according to the invention, to select a temperature above $T_{Eu}$. This has the advantage that the aluminium present in deficiency partly dissolves the silicon at the surface, and a phase mixture of the liquid eutectic and solid-state silicon forms. Since the phase diagram requires an increase of the silicon content in the melt in the course of this further heating, which is satisfied by further partial dissolution of silicon, the process according to the invention has the advantage that the depth of the partly dissolved region of silicon can be controlled via the selected temperature and the amount of aluminium used.

The doping range of the silicon with aluminium can more preferably be adjusted via the selection of the temperature in step (f).

This is because cooling the melt and the solid-state silicon again in step (g) of the process according to the invention causes the melt to solidify again from the silicon side as a result of solid-state epitaxy according to the phase diagram. The eutectic forms again at 577° C. and decomposes in the course of further cooling to solid-state aluminium having a small percentage of silicon and a further solid-state component of apparently 100% silicon.

A more exact analysis reported, for example, by B. F. A. Trumbore in "*Solid Solubilities of Impurity Elements in Germanium and Silicon*", *Bell System Tech. J.*, vol. 39, 1960, however, shows that the solid-state silicon absorbs aluminium up to a concentration of more than $10^{19}$ cm$^{-3}$. This Al concentration, which is indiscernible in the phase diagram, can surprisingly be utilized as a high-concentration dopant in the context of the present invention.

The formulation can decompose to further organic and/or inorganic components during step (f). In this case, these components are driven out together with the hydrogen and, if used, the solvent(s).

Steps (a)-(c), preferably (a) and (b), can be repeated as often as desired. More preferably, (a) and (b) can be repeated once. When (a) and (b) or (a)-(c) are repeated at least once, the same or a different liquid silane formulation, more preferably a different liquid silane formulation, may be provided on each repetition. Additionally more preferably, in the case of repetition, the liquid silane formulation can be admixed with dopant selected from at least one aluminium compound or at least one boron compound in order to obtain a p-doped silicon layer after step (c). Additionally preferably, steps (d)-(f) may be repeated at least once.

In a particularly advantageous development of the process according to the invention, liquid silane formulation is applied to the substrate in step (b) in such a way that, after step (c), a silicon layer is obtained which has a thickness of not more than 200 nm. The thickness is controlled in a known manner by the coating process, for example by speed in the case of spin-coating or by the type of coating bar and/or the size of the gap in the case of coating bar methods.

In order to achieve a pn junction which has a defined profile of the charge carrier concentration and is useable for semiconductor technology in such a thin silicon layer, one theoretically conceivable procedure is the implantation or diffusion of dopant atoms. However, in the prior art, such a pn junction cannot be produced economically in a silicon layer of thickness 200 nm either by implantation, or by diffusion.

In contrast, the process according to the invention surprisingly also allows the control of depth distribution: for this purpose, the surface doping requires the provision of a minimum amount of $AlH_3$. The depth distribution is controlled via the temperature profile during the formation of the silicon/aluminium eutectic in steps (f) and (g).

The present invention likewise provides a doped silicon layer which is obtained by the process according to the invention.

The process according to the invention can preferably be used to obtain a sequence of doped silicon layers, of which at least one layer has p-overdoping at the phase boundary to an n-doped base layer. More preferably, a homojunction is obtainable by the process claimed. Homojunctions are known to those skilled in the art, for example in the case of oppositely doped wafers which may have a perfect np junction.

A layer sequence with an nip structure is likewise obtainable by the process according to the invention, in the case of which an undoped intrinsic intermediate layer or intermediate layers is/are incorporated between the n- or p-doped silicon layer or silicon layers. For this purpose, the process according to the invention is used to supply the i-layer containing the aluminium with p-doping on the outer layer thereof. More preferably, in the process according to the invention, a first n-doped layer can be applied, which, after step (c), has a thickness of 200 nm, followed by a further coating with an undoped silicon layer which preferably has a greater thickness than the first n-doped layer, more preferably a thickness of 0.3 to 2 μm. This second layer can preferably be obtained by repeated performance of steps (b) and (c). When steps (d) to (g) of the process according to the invention are subsequently carried out, a highly doped $p^+$ layer thus recrystallizes out of the eutectic. After step (g) an nip layer sequence is then present, which can be used as a polymorphic nip solar cell analogously to an amorphous nip solar cell.

The invention therefore likewise provides for the use of the doped silicon layers produced in accordance with the invention for production of light-sensitive elements.

The present invention further provides for the use of the doped silicon layers produced in accordance with the invention for production of electronic components.

The inventive electronic component may preferably be a photovoltaic element, solar cell, tandem solar cell, photodiode, suppressor diode, light-sensitive transistor, varistor, thyristor, an electronic or mechatronic circuit or arrangement comprising solar cells, or an electronic system, for example control mechatronics in a solar power plant.

FIG. 1 shows a schematic of the partial dissolution and solidification process for an aluminium-silicon structure. The substrate on which the structure is present behaves passively at the temperatures indicated, and is therefore not shown in the diagram.

The invention claimed is:

1. A process for producing a doped silicon layer on a substrate, comprising:
    (a) applying a liquid silane formulation to a substrate,
    (b) introducing electromagnetic energy, thermal energy, or both, to obtain an at least partly polymorphic silicon layer,
    (c) applying to the at least partly polymorphic silicon layer a second liquid formulation comprising a metal complex comprising aluminum, to obtain a coating,
    (d) heating the coating by introducing electromagnetic energy, thermal energy, or both, which decomposes the second liquid formulation at least to metal and hydrogen, and then
    (e) cooling the coating to obtain an Al-doped or Al- and metal-doped silicon layer.

2. The process of claim 1, further comprising, between (b) and (c), heating the at least partly polymorphic silicon layer to a temperature of 300 to 1000° C. and then cooling the at least partly polymorphic silicon layer.

3. A doped silicon layer obtained by the process of claim 1.

4. A method of producing a light-sensitive element, employing the doped silicon layer of claim 3.

5. A method of producing an electronic component, employing the doped silicon layer of claim 3.

6. The process of claim 1, wherein the substrate has a reverse side contact to an output of a current generated.

7. The process of claim 1, wherein the substrate is selected from the group consisting of a metal, a conductive material, an insulator coated with a conductive material, and a semiconductor coated with a conductive material.

8. The process of claim 1, wherein the second liquid formulation further comprises a trivalent metal selected from the group consisting of B, Ga, In, and Tl.

9. The process of claim 1, wherein the second liquid formulation comprises at least one selected from the group consisting of a metal hydride, a metal hydridoalkyl, a metal alkyl, and a metal alkyl halogen.

10. The process of claim 1, wherein the second liquid formulation comprises Al and B.

11. The process of claim 1, wherein the metal complex comprising aluminum is a liquid aluminum hydride complex.

12. The process of claim 1, wherein the heating in (d) is to a temperature of at least 577° C.

13. The process of claim 1, wherein the applying (a) of the liquid silane formulation to the substrate is repeated at least once.

14. The process of claim 1, wherein the applying (a) of the liquid silane formulation to the substrate, and the introducing (b) of electromagnetic energy, thermal energy, or both, to obtain an at least partly polymorphic silicon layer, are repeated at least once.

15. The process of claim 13, wherein a different liquid silane formulation is applied during each repetition.

16. The process of claim 14, wherein a different liquid silane formulation is applied during each repetition.

17. The process of claim 13, wherein the liquid silane formulation is admixed with a dopant selected from an aluminum compound or a boron compound, to obtain a p-doped silicon layer after (b).

18. The process of claim 1, wherein the applying (c) of the second liquid formulation to the at least partly polymorphic silicon layer, and the heating (d) of the coating, are repeated at least once.

19. The process of claim 1, wherein after (b) the at least partly polymorphic silicon layer has a thickness of not more than 200 nm.

20. The process of claim 16, wherein a first at least partly polymorphic silicon layer is n-doped and has a thickness of not more than 200 nm, and a second at least partly polymorphic silicon layer is undoped and has a thickness of 0.3 to 2 µm.

* * * * *